United States Patent
Balard et al.

(10) Patent No.: US 6,396,426 B1
(45) Date of Patent: May 28, 2002

(54) EMBEDDED MECHANISM OFFERING REAL-TIME SELF FAILURE DETECTION FOR AN ANALOG TO DIGITAL CONVERTER

(75) Inventors: Eric Balard, Vence; Jacques Sonzogni, Fuveau, both of (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/412,919

(22) Filed: Oct. 5, 1999

(30) Foreign Application Priority Data

Oct. 5, 1998 (FR) .............................. 98 12452

(51) Int. Cl.⁷ ................................................ H03M 1/10
(52) U.S. Cl. ...................................... 341/120; 341/155
(58) Field of Search ................................ 341/120, 118, 341/116, 155

(56) References Cited

U.S. PATENT DOCUMENTS

| | | | | |
|---|---|---|---|---|
| 3,579,103 A | * | 5/1971 | Russell | 341/118 |
| 4,580,126 A | * | 4/1986 | Kato et al. | 341/120 |
| 4,700,174 A | * | 10/1987 | Sutherland et al. | 341/120 |
| 4,940,947 A | * | 7/1990 | McCartney et al. | 324/613 |
| 4,947,106 A | * | 8/1990 | Chism | 341/118 |
| 5,235,333 A | * | 8/1993 | Naylor et al. | 341/118 |
| 5,305,003 A | * | 4/1994 | Han | 341/120 |
| 5,870,042 A | * | 2/1999 | Noda | 341/120 |
| 6,188,057 B1 | * | 2/2001 | Misec | 250/208.1 |

* cited by examiner

*Primary Examiner*—Peguy JeanPierre
*Assistant Examiner*—Jean Bruner Jeanglaude
(74) *Attorney, Agent, or Firm*—William B. Kempler; Frederick J. Telecky, Jr.

(57) ABSTRACT

This invention describes a real-time failure detection system for the inputs of an analog-to-digital converter. A novel mechanism is proposed that provides recognition of an ADC input pin failure through the digital result obtained. The device includes a specific hardware architecture which can be added to any ADC core. This is especially useful in safety applications (where FMEA is a main concern), as it greatly increases the reliability of the analog data measured.

28 Claims, 5 Drawing Sheets

EMBEDDED MECHANISM OFFERING REAL-TIME SELF FAILURE DETECTION FOR AN ANALOG TO DIGITAL CONVERTER

BACKGROUND AND SUMMARY OF THE INVENTION

The present invention relates to analog-to-digital converters, particularly to real-time failure detection systems for such converters.

Background: Analog-to-Digital Converters

Analog-to-digital conversion is the process of converting an analog data signal, which is most commonly represented as voltage, into a digital format. Determining a digital value which represents a particular analog input is known as "quantization". Successive approximation, serial, delta-sigma or oversampling, parallel, and pipelined are some of the many different analog to digital conversion architectures which currently exist.

Analog-to-digital converters (ADCs) are used increasingly in a wide range of applications. ADCs enable many systems to implement real-time processing of analog data. Such data capture and processing systems usually include sensors for collection of analog information and digital signal processors (DSPs) or microprocessors for processing of the data. Since the sensors deliver analog voltages whereas the processors compute digital values, an ADC, either as an embedded function or as a stand-alone chip, is needed to convert the data.

The ADCs in such real-time processing systems are expected to provide reliable data to the processor which acts on the information. Reliable data is required to ensure a reliable system response. This dependence is especially true of systems which are designed to perform safety related tasks. Several examples of these tasks can be found in the automotive industry. For example, engine and transmission control tasks, such as engine knock detection, as well as anti-lock braking systems (ABS) have a direct relationship to the safety of a vehicle. In such systems, reliability is paramount. Consequently, an ADC must provide reliable data to the processor to aid in a reliable system response.

Background: Failure Detection

In general, modern ADCs have multiple connections, both internally and externally. One ADC can be used to provide digital output for many (16, 32, or more) analog input connections (or "pins"). Failures in such ADCs can appear anywhere. For example, a high voltage stress to a pin while an application is running can create an open or short circuit condition. By computing an incorrect value, and hence, wrong data, the digital processor can enter a critical and dangerous situation. This potential is especially true of safety critical applications such as those in the automobile industry.

FMEA

Mary automakers have adopted the failure mode and effect analysis (FMEA) discipline. The goal of FMEA is to identify and minimize the effects of potential problems in product or process designs. The fundamental questions answered under the discipline are:

1) How might the product fail?
2) What might be the cause and effect of such a failure? and
3) What controls are in place to detect such a failure?

Thus, FMEA seeks to eliminate costly failures in the manufacture of a product by ensuring critical issues are addressed before expensive commitments are made.

Background: Current Real-Time Failure Detection Solutions

Several methods currently exist to self-test and detect the failure of analog-to-digital converters. The digital communication, from an ADC to a processor, is checked through bus protocols and/or software algorithms. However, the analog signal itself could be corrupt. For example, the analog voltage to be converted can be issued from a "bad source". Bad source failures include situations such as open circuits or circuits shorted to ground or to a power supply. Such bad source failures can leave the ADC input pin(s) in a floating potential. These failures will not be detected by the testing of the ADC core (the converter circuitry itself) or by the testing of digital communications between the ADC core and a processor. To be efficient, the failure detection system must include a check from the pin connection to the digital communications (ADC to processor). Additionally, the pin connections must be tested all along the application.

A majority of the real-time failure detection in ADCs is carried out through the use of a small number of solutions. The most common solution employs a redundant ADC. The two ADCs are used to perform parallel conversions of a single analog voltage connected to one single-ended input of each ADC. The results of the parallel conversions are compared by the processor. If the results match, within limits, then no failure is detected. However, failure of the results to match, within limits, indicates that a failure has occurred. This functional redundance solution permits detection of a failure on one of the two connections. However, it requires duplicate ADC core hardware, increasing expense. Another problem with this redundancy solution is that it offers no indication of the type of failure that has occurred e.g., pin open, pin short, etc.

Another frequently implemented solution is the connection of a single input voltage to two different channels of a single ADC core. Use of this solution allows for the detection of a failure in the ADC due to a pin problem. Such a failure can be due to an open or a shorted pin. However, this solution, by itself, precludes the recognition of other failures. These other failures can include internal connection problems in the ADC module. Such problems can occur at the digital interface with the ADC core. Another disadvantage of this solution is increased production expense. The redundancy requirement of the additional channel impairs the cost effectiveness of this solution. Redundancy also results in increased conversion time. Conversion time for this solution is doubled since conversion are performed sequentially.

Both of the current solutions based on redundancy require either hardware or software control (via a microprocessor). Added control requirements results in hardware logic or code overhead (requiring additional memory size). Either method of control implementation requires an increased system size and hence, an increased cost.

Another self-test solution used in ADCs, such as the TLC2543 by Texas Instruments, is the use of three reference voltages. In such solutions, an additional known voltage source is provided to the ADC. This additional voltage source is provided on a dedicated input. Such a test can be used to check the ADC core and is often used as a production test to validate ADC functionality.

Real-Time Self Failure Detection for Analog to Digital Converter

The present application discloses a real-time self failure detection mechanism for analog-to-digital converters. The output line of an analog signal to be sampled is connected to the input of an ADC along with a reference test voltage that is either high or low. In the presently preferred embodiment, analog sensors, for example, those which produce engine control data, provide signals within various operational ranges. During the sampling phase of an analog-to-digital conversion, a high test voltage will tend to drive the sampled value above the operational range of the analog signal. A low test voltage will drive the sampled value below the operational range of the analog signal.

After a programmable sample time has elapsed, the test voltage is disconnected from the input line, leaving only the analog output line connected to the ADC input. After a second programmable sample time, the signal at the ADC input is converted to a digital value by the ADC core, The result, a digital value, is analyzed to determine if a failure has occurred. If the result is outside the operational range of the particular sensor, a failure is indicated.

In one class of embodiments, the type of failure that has occurred can be determined by switching the test voltage. That is, if the previous test voltage was high, the test is performed again with a low test voltage, or vice-versa. If the second result remains relatively unchanged from the first, the failure indicated is a short of the pin to ground or the power supply, regardless of test voltage. If the result approximates the test voltage after each switch, that is, when the test voltage is high the result is above the operational range of the analog signal, or vice versa, the failure indicated is an open pin. An open pin failure indicates that no analog signal is being received at the ADC core.

An advantage of the present disclosure is that it is easy to implement and compatible with any CMOS standard process. The disclosed method relies only on analog switches and resistors that do not require a high degree of accuracy.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Self-Test Failure Detection

The presently preferred embodiment provides an efficient and cost effective solution to the production of reliable ADC systems using real-time detection of ADC pin defects. Real-time indications of failure occur due to the results of the ADC conversion being obtained and analyzed while the ADC is active in a particular application.

Figure 1:
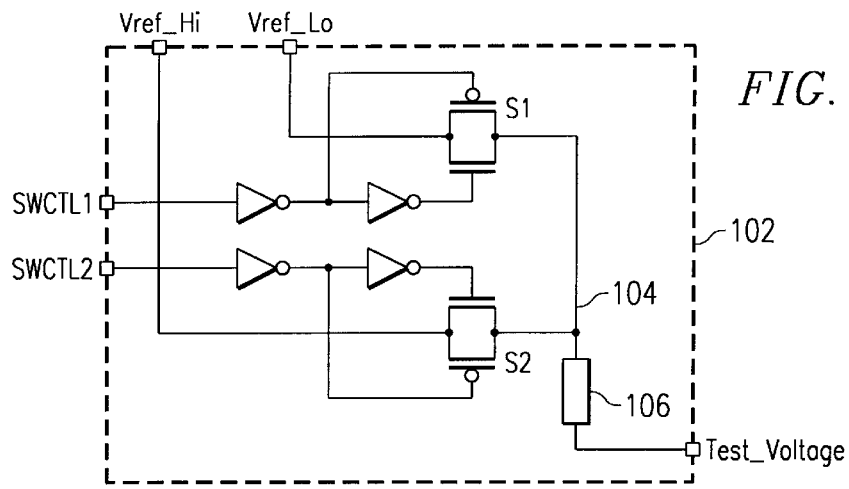
FIG. 1 depicts a detailed diagram of the fail test facilities 102.

FIG. 1 depicts a detailed diagram of the fail test facilities 102. The fail test facilities 102 provide a programmable test voltage ($V_{ref\_Hi}$ or $V_{ref\_Lo}$) based on signals received at control switches Swctl1 and Swctl2. Analog switch S1 is connected to voltage_low (or $V_{ref\_Lo}$). Analog switch S2 is connected to voltage_high (or $V_{ref\_Hi}$). The output of both switches is connected together at node 104. Signals Swctl1 and Swctl2 are connected to act as a multiplexer, opening or closing switches S1 and S2 according to signals received from a self-test controller 202. The table below describes the behavior of the switches and the voltage received at node 104 for each possible switch combination:

| Swctl1 | Swctl2 | Node 104 Voltage |
|--------|--------|------------------|
| 0 | 0 | open |
| 0 | 1 | $V_{ref\_Hi}$ |
| 1 | 0 | $V_{ref\_Lo}$ |
| 1 | 1 | reserved |

When both switches, S1 and S2, are opened, self-test mode is disabled, allowing the ADC to function as a normal ADC. The signal at node 104 is connected to a resistor 106. The output of resistor 106 provides Test_Voltage, which is either $V_{ref\_Hi}$ or $V_{ref\_Lo}$, to the ADC core.

Figure 2:
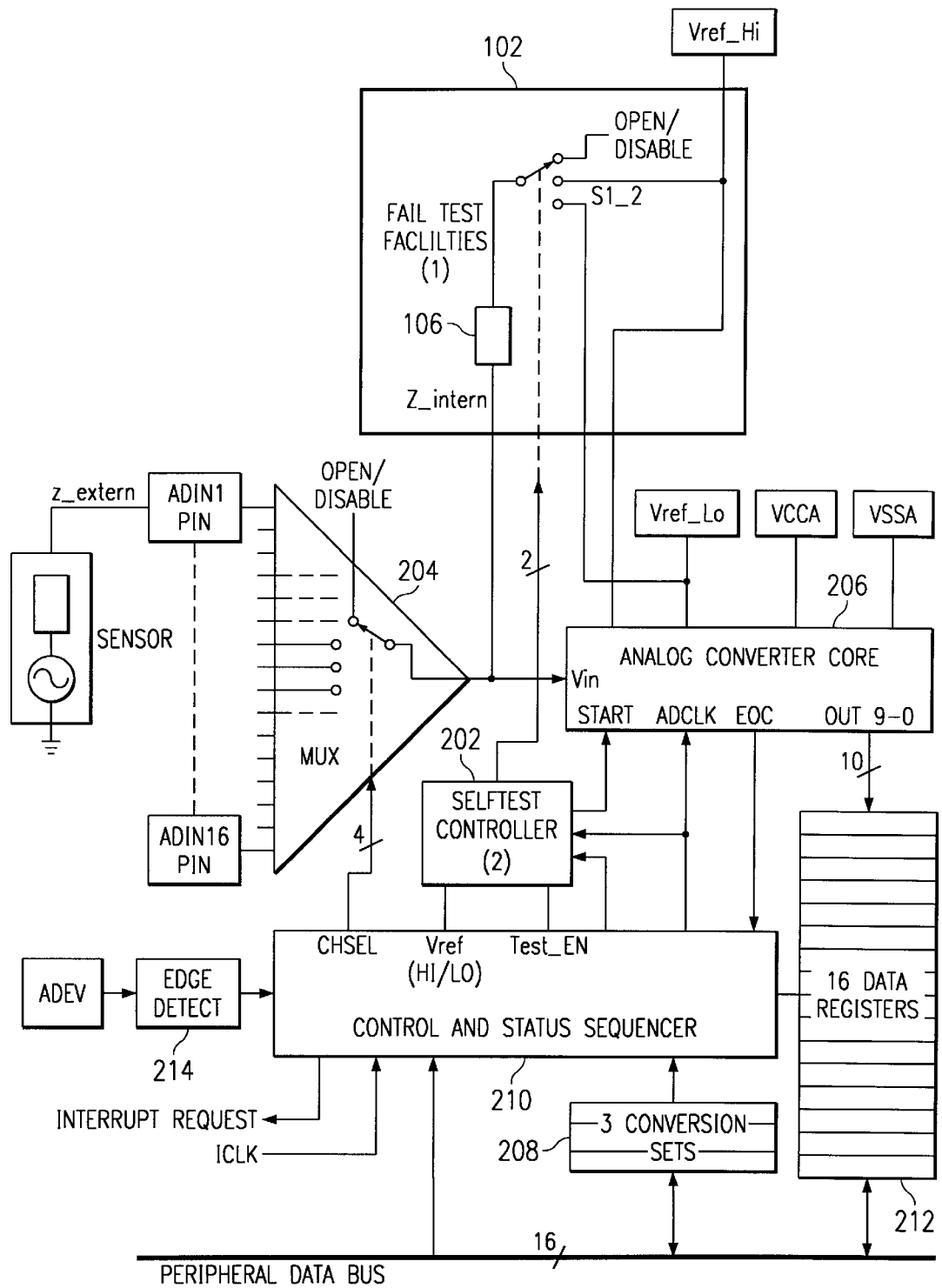
FIG. 2 depicts a block diagram of an ADC.

FIG. 2 depicts a block diagram of an ADC such as the TMS470 produced by Texas Instruments. The self-test controller block 202 controls the fail test facilities block 102, and the sampling period of the ADC following a self-test sequence.

The input multiplexer (or "MUX") 204 connects a selected input channel (or "pin") to the $V_{in}$ input of the ADC core 206. In the presently preferred embodiment, the selected pin, ADINx, can be one of 16 inputs to the input MUX 204. The selected pin is determined by three conversion sets 208. In the ADC depicted, as many as 16 different channels can be converted sequentially. The Chsel bus from the control and status sequencer 210 controls the MUX 204 according to the conversion sets and a control register. Additionally, the MUX 204 can be placed in a open (or disabled) state. In such an open state no pins are selected. The only input on $V_{in}$ comes from either $V_{ref\_Hi}$ or $V_{ref\_Lo}$. This state allows for a test of the ADC core with known values.

In the presently preferred embodiment, the ADC core 206 is a 10-bit sampling successive approximation register-based architecture. The analog conversion range is determined by the reference voltages: $V_{ref\_Hi}$ and $V_{ref\_Lo}$. The reference voltages are considered "out-of-bounds" as they are outside the operational range of sensors which supply analog data to be converted. These voltages are application dependent and represent the maximum and minimum voltages, respectively, that can be converted in a given application. The selected reference values for $V_{ref\_Hi}$ and $V_{ref\_Lo}$ apply to each on the ADC input channels, ADINx.

For each application, the reference voltage, $V_{ref\_Hi}$, is within the range $V_{ref\_Lo} < V_{ref\_Hi} < V_{CCA}$, where $V_{CCA}$ is a supply voltage input. In the presently preferred embodiment, $V_{CCA}$ is 2.7 to 3.6 Vdc. The reference voltage $V_{ref\_Lo}$ is within the range $V_{SSA} < V_{ref\_Lo} < V_{ref\_Hi}$, where $V_{SSA}$ is a ground voltage input. In the presently preferred embodiment, $V_{SSA}$ is 0.0 Vdc±0.1 Vdc. Ideally, in the presently preferred embodiment, analog voltages greater than $V_{ref\_Hi}$ convert to a digital value of 0x3 FF and analog input voltages less than $V_{ref\_Lo}$ convert to a digital value of 0x000. Voltages between $V_{ref\_Hi}$ and $V_{ref\_Lo}$ convert to a digital value that is ratiometric to (scaled proportionally to) the difference of $V_{ref\_Hi}$ and $V_{ref\_Lo}$. The digital result is approximated by: $1023*(\text{Input\_Voltage}-V_{ref\_Lo})/(V_{ref\_Hi}-V_{ref\_Lo})$ The control and status sequencer 210 initiates the conversion process.

The ADC also contains 16 result registers 212, one for each input channel of the MUX 204. At the end of a conversion, the digital result is loaded into the register corresponding to the channel number of the signal being converted. The event edge detect 214 is used to detect an expected event ADEV and then begin an analog-to-digital conversion.

ADC Measurement Sequence

Figure 3:
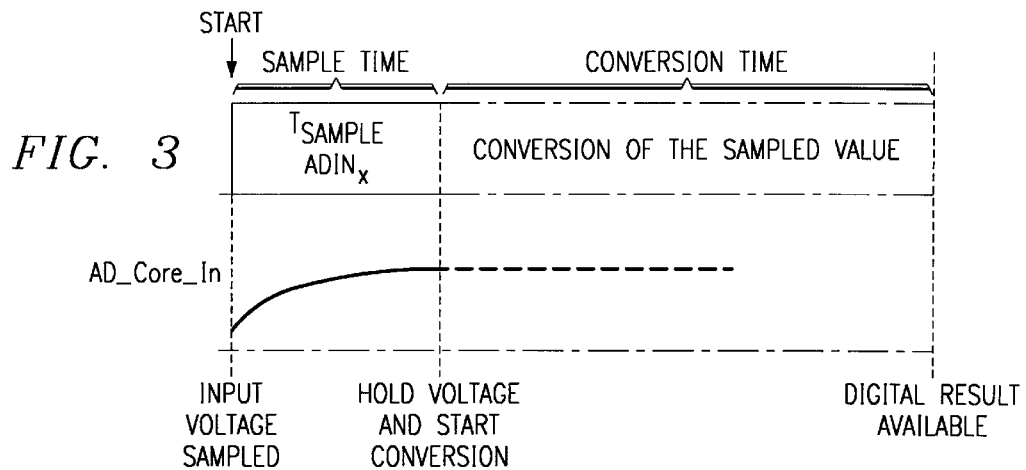
FIG. 3 depicts the timing sequence of an ADC conversion in a normal conversion mode.

FIG. 3 depicts the timing sequence of an ADC conversion in a normal conversion mode. The total time required to sample and convert is a function of an interface clock period ($T_{ICLK}$), a pre-scaler value ($P_S$), and a sample period selection ($A_{CQ}$). The pre-scaler value ($P_S$) is used to derive an ADC clock period (ADCLK) from the interface clock (ICLK). In the presently preferred embodiment, to ensure an accurate conversion, the pre-scaler value, $P_S$ should be selected such that 40 ns<$T_{ICLK}* P_S$<10 us. Also, in the presently preferred embodiment, both $P_S$ and $A_{CQ}$ are programmable. Time, $T_{SAMPLE}$, for a given pin, ADINx, is depicted in FIG. 3. $T_{SAMPLE}$ is equal to $T_{ICLK}*P_S*A_{CQ}$. For example, in the presently preferred embodiment, an ADC core with a 20 MHz ICLK, a $P_S$ of 2 and an $A_{CQ}$ of 8 would have a $T_{SAMPLE}$ of 50 ns*2*8 or 0.8 microseconds. During $T_{SAMPLE}$, the input voltage (ADINx) pin is sampled. At the end of time $T_{SAMPLE}$, the sampled voltage is held and conversion time, $T_{CONV}$, begins. $T_{CONV}$ is equal to $T_{ICLK}*P_S*10$. Using the above example, $T_{CONV}$ would equal 50 ns*2*10 or 1.0 microseconds. During $T_{CONV}$, the held voltage is converted by the ADC core to a digital value. At the end of $T_{CONV}$ the digital value is available for use. The total conversion time, $T_{TOT}$, is equal to $T_{ICLK}*P_S*(A_{CQ}+10)$. In this example, $T_{TOT}$ is equal to 1.8 microseconds.

Self-Test Mode

Figure 4:
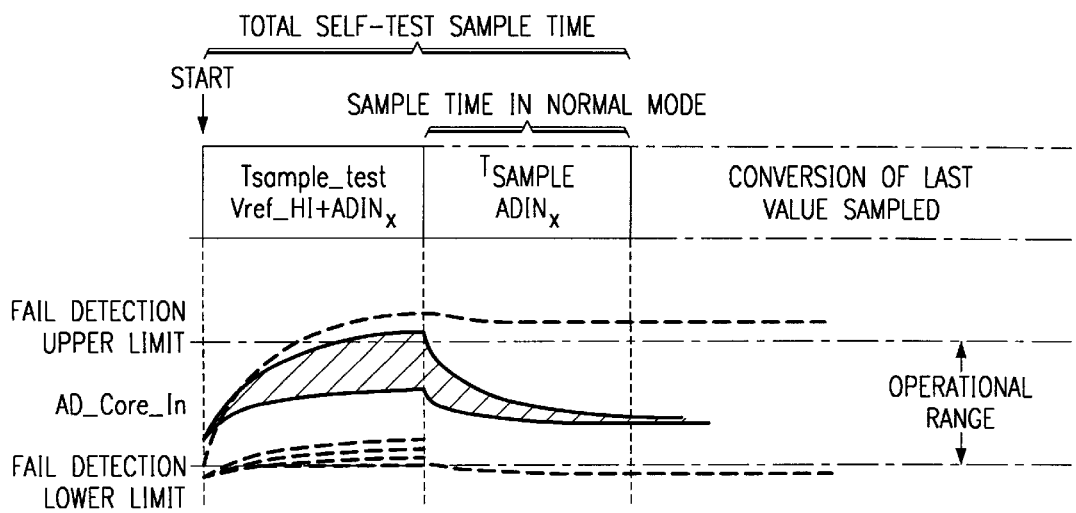
FIG. 4 depicts the timing sequence of an ADC conversion in self test mode.

FIG. 4 depicts the timing sequence of an ADC conversion in self-test mode. Self-test mode is an active mode that inserts a real-time failure detection step into the normal conversion process. The purpose of the self test mode is to ensure that the digital value is issued from reliable data/voltage capture and is not within the fail detection limits of the analog sensor. The self-test mode allows the application program to connect a reference voltage, $V_{ref\_Hi}$ or $V_{ref\_Lo}$, through a resistor 106 to the ADC core 206 in order to detect an open pin or shorted pin failure. In self-test operation, the main objective of the serial resistor 106 is to limit the current flowing from the reference voltage to an external impedance (sensor) or to a pin which has failed by shorting to power supply or ground. In the presently preferred embodiment, the selection of the reference voltage to be applied, $V_{ref\_Hi}$ or $V_{ref\_Lo}$, is defined by register bits and is application dependent.

In self-test mode, the sampling time is increased by a factor of two due to the insertion of an extra step. The self test sequence starts with one additional step, $T_{SAMPLE\_TEST}$, versus the normal conversion mode sequence. In the presently preferred embodiment, $T_{SAMPLE\_TEST}$ is equal to $T_{SAMPLE}$.

During this $T_{SAMPLE\_TEST}$ time, both the selected input voltage (ADINx) pin and a test voltage are connected together to the ADC converter core input $V_{in}$. The example in FIG. 4 depicts reference voltage $V_{ref\_Hi}$ being connected together with ADINx. Thus, $V_{in}$, during the $T_{SAMPLE\_TEST}$ time, tends to be driven above the operational range of the sensor providing ADINx. A reference voltage of $V_{ref\_Lo}$ would have the opposite effect, driving $V_{in}$ below the operational range of the sensor providing ADINx.

When $T_{SAMPLE\_TEST}$ has elapsed, the reference voltage, $V_{ref\_Hi}$ or $V_{ref\_Lo}$, is disconnected. The pin, ADINx, is left as the only connection to $V_{in}$. The analog signal at $V_{in}$ is then sampled and converted as in the normal conversion mode. Thus, the conversion process while in self-test mode has a time of $T_{SAMPLE\_TEST}+T_{SAMPLE}+T_{CONV}$.

The digital value obtained is directed to the register 212 associated with the selected channel (x). The control and status sequencer 210 can then read and analyze the result. If the pin, ADINx, is open during $T_{SAMPLE\_TEST}$, the digital value is equal to the programmed test voltage. If the pin, ADINx is shorted during $T_{SAMPLE\_TEST}$, the nature of the short, that is, to ground or to power supply can be determined with a second conversion result in the fail detection range.

The reference voltage is pre-charged during $T_{SAMPLE\_TEST}$. If a shorted pin failure occurs, the digital value could be $V_{ref\_Hi}$ indicating that the pin is shorted to the power supply or $V_{ref\_Lo}$ indicating that the pin is shorted to ground. When a pin is shorted, the serial resistor 106 limits the current supplied to $V_{in}$.

If an open pin failure occurs, the reference voltage is not modified during $T_{SAMPLE}$. The reference voltage is then converted. The digital value obtained is equal to the programmed reference voltage. This result is due to the absence of a sensor voltage to sample on the pin.

The type of failure is not always immediately evident. For example, if the reference voltage is $V_{ref\_Hi}$ and the digital result is also $V_{ref\_Hi}$, a failure is indicated. However, the failure could result from an open pin or from a pin shorted to power supply. The same is true for a reference voltage and digital value of $V_{ref\_Lo}$, although in this case the pin could be shorted to ground. The type of failure that has occurred can be determined by switching the reference voltage source from $V_{ref\_Hi}$ to $V_{ref\_Lo}$ in the first example and from $V_{ref\_Lo}$ to $V_{ref\_Hi}$ in the second example. A change in digital value indicates that an open pin failure has occurred. If no change in digital value occurs, a shorted pin, to either ground or the power supply, is indicated by a digital value of $V_{ref\_Lo}$ or $V_{ref\_Hi}$ respectively.

If the pin, ADINx, is properly connected during $T_{\_SAMPLE\_TEST}$, both the reference and input voltages are connected together to the ADC core 206 at $V_{in}$. During $T_{SAMPLE}$ the reference source is removed. Only the input pin, ADINx, remains connected to $V_{in}$. Therefore, the pre-charged voltage is modified to reach the input pin, ADINx, voltage. In turn, it is this input pin voltage, ADINx, which is finally converted. The digital value will be in the proper conversion range for the given sensor which supplied the analog signal. In the presently preferred embodiment, the upper and lower limit of the failure detection is application dependent. Depending on the sensor/resistor 106 impedance ratio, a sampled value of $V_{ref\_Hi}$ (or $V_{ref\_Lo}$) may not be achieved but may be shifted toward $V_{ref\_Hi}$ (or $V_{ref\_Lo}$). This shift tendency allows for a wide range of sensor input to be utilized with real-time self-test failure detection.

Alternative Embodiment: Variable Resistor

In an alternative embodiment, resistor 106 can be made to be programmable to implement different resistor values. The connected resistor is defined through a selection register. The resistor value is adjusted depending on the impedance of the particular sensor being sampled. Such an embodiment provides a flexible test solution for varying types of sensors.

Alternative Embodiment: Diagnostic Mode

In another alternative embodiment, the programmable resistor, described above, can be used in implementing a diagnostic mode in the sequencer the diagnostic mode would be similar in function to the ADC's normal mode of operation. However, the sample would consist of the sample that is obtained during the failure detection mode's $T_{SAMPLE\_TEST}$ time. That is, the sample to be converted would be a reference voltage plus the ADINx voltage. After a normal mode conversion which yields a digital value, x, the diagnostic mode can test the ability of the ADC to shift the value to x±y. The ± depends upon the reference voltage selected, $V_{ref\_Hi}$ or $V_{ref\_Lo}$. The y depends upon the impedance ratio of the sensor and resistor 106. If the digital value can be shifted then no short is detected. If, given the proper resistor value, the digital value cannot be shifted, the input voltage is fixed and therefore shorted to the measured potential.

Alternative Embodiment: Limited Self Test

In another alternative embodiment, only the test voltage, $V_{ref\_Hi}$ or $V_{ref\_Lo}$, is connected to the input of the ADC during $T_{SAMPLE\_TEST}$. Connection of the test voltage alone allows for a test of some but not all of the failures that can occur between the sensor and the ADC.

Alternative Embodiment: Other Input Types

In another alternative embodiment, the fail test facilities described in FIG. 1 can be advantageously applied to in situations other than analog-to-digital converters. For example, with input or input/output type pins such as digital I/O, analog filter input, or amplifier input, the fail test facilities can be used to indicated open or shorted pins. This holds true for most inputs as long as the pin is high impedance. Thus, the test voltage as well as the short or open pin analysis is dependent only on the circuit type and application.

Engine Control Unit

Figure 5:
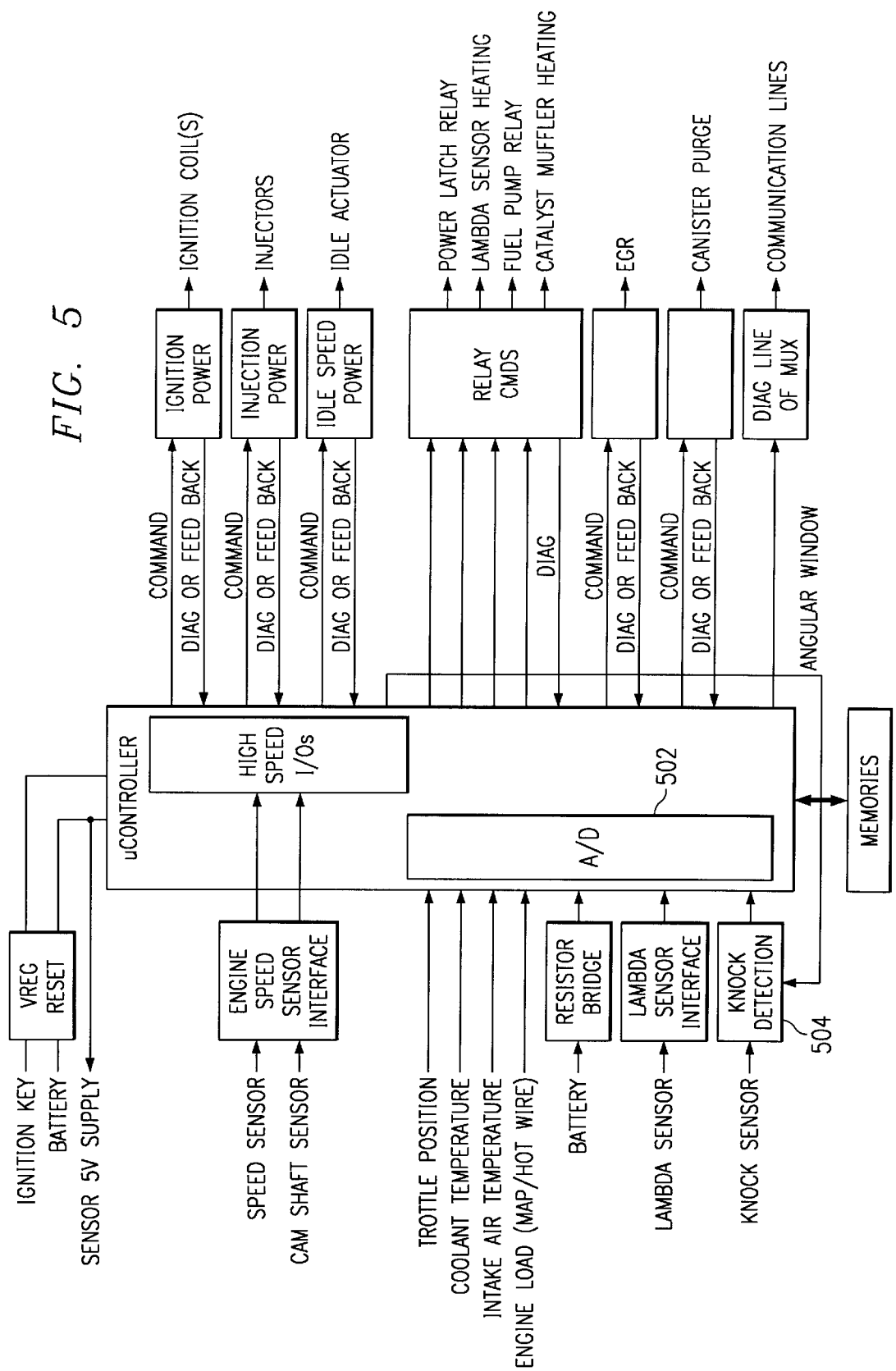
FIG. 5 depicts a block diagram of an electronic control unit.

FIG. 5 depicts a block diagram of an electronic control unit (ECU) for an automobile engine. The ECU is a microcontroller, connected to memory, with high speed input and output (or "I/O") ports and an ADC. The high speed I/O ports enable the ECU to monitor digital sensor information such as the speed of the automobile and the speed and position of the cam shaft. In addition, the ECU can monitor and control engine functions such as ignition power, injection power, and idle speed and power. The ADC 502 of the ECU enables monitoring of sensor information which originates in analog form. Such information includes throttle position, temperatures such as engine coolant and intake air, and engine functions such as a knock sensor 504. In turn, the ECU can control engine functions such as idle speed and power, ignition power, and injection power. The ECU can also control the operation of functions that interface with the engine such as fuel pump and catalyst muffler heating relays and exhaust gas return (EGR) systems. In the presently preferred embodiment, ADC 502 can take advantage of the disclosed real-time self-test failure detection method.

Engine Knock

Engine knock occurs when both the temperature and pressure in a particular engine cylinder exceed certain limits. The combination of high temperature and pressure causes any unburned fuel mixture to burn at a highly accelerated rate. This flash burning creates a pressure peak within the cylinder. The pressure peak can cause serious damage to the piston if the knock continues. Engine knock has certain characteristics which enable it to be detected by the ECU. Knock occurs during a narrowly defined window of the combustion phase of the cylinder. Also, knock has a specific frequency. The frequency is engine dependent but is usually between 8 and 15 Khz.

Figure 6A:
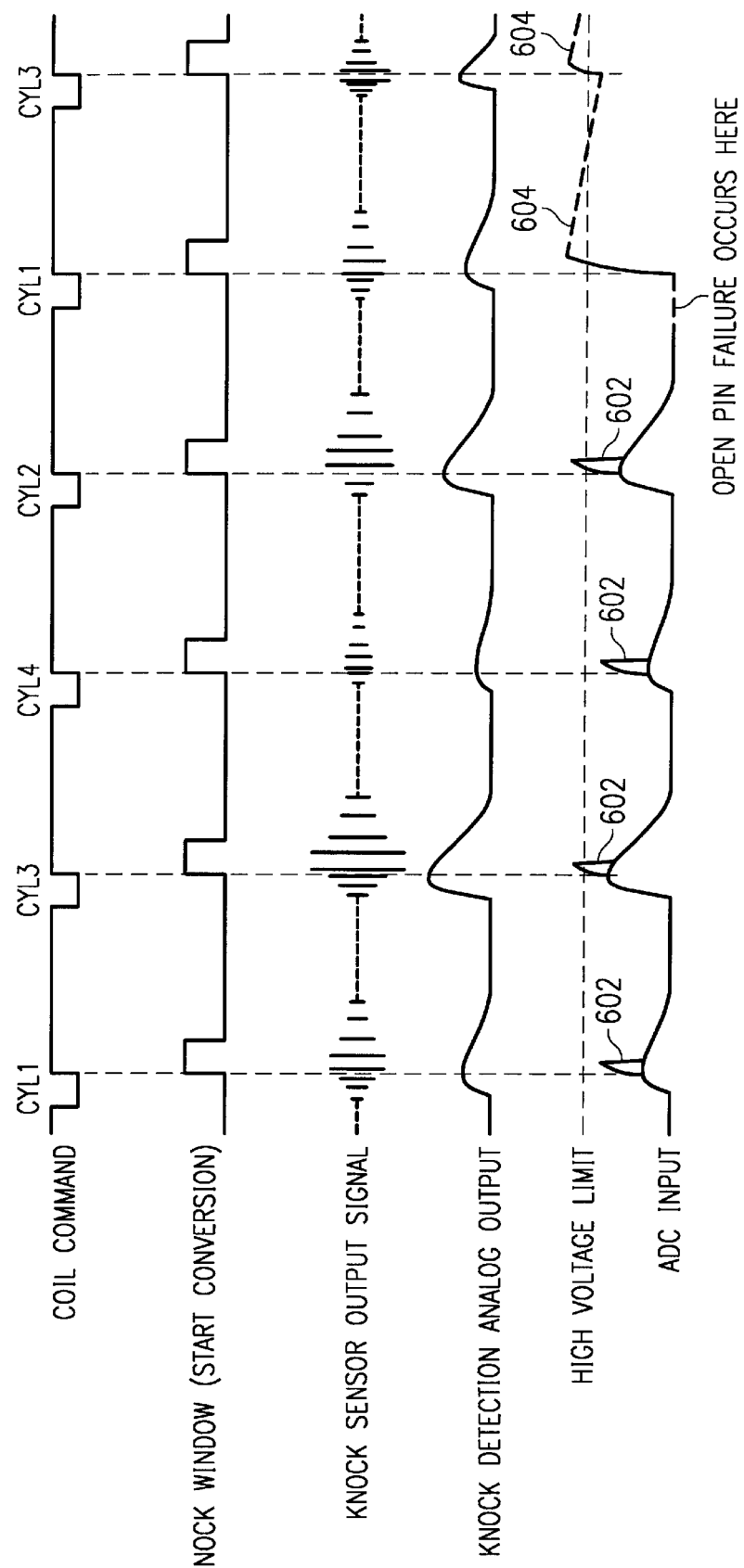
FIGS. 6A, 6B, and 6C depict the sensor signal and conversion timing sequence of an engine knock signal.
Figure 6B:
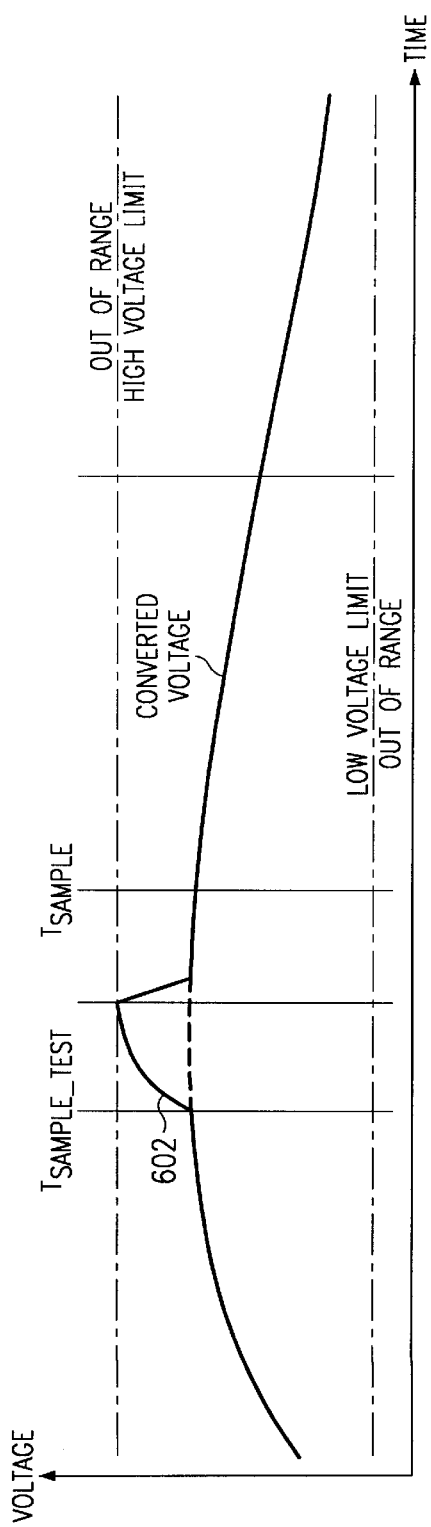
Figure 6C:
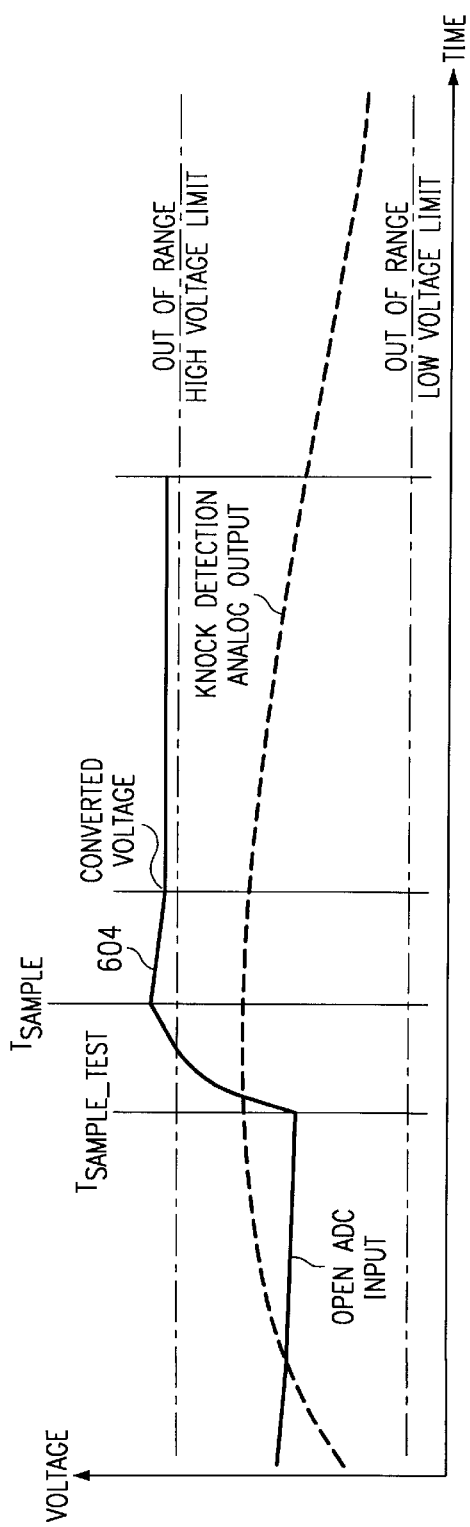

FIGS. 6A, 6B, and 6C depict the sensor signal and conversion timing sequence of the signal received from an engine knock sensor 504. In FIG. 6A, knock detection analog output is the output of the knock sensor normally received by pin ADINx when that pin is connected to a knock sensor. The input to the $V_{in}$ of the ADC 502 is depicted as ADC input. The input closely follows the knock detection analog output via pin ADINx. The spikes 602 represent a rise in the analog input to the ADC 502 caused by connecting $V_{Ref\_Hi}$ to $V_{in}$ while sampling the knock sensor signal. At spikes 604, an open pin failure is depicted. The ADC input no longer follows the knock detection analog output.

FIG. 6B depicts an isolated view of one of the sample and conversion periods containing spike 602. During time $T_{SAMPLE\_TEST}$, the knock detection analog output, via ADINx, is driven towards an out of range limit by $V_{ref\_Hi}$. Spike 602 results. During $T_{SAMPLE}$, the $V_{ref\_Hi}$ connection is released and the input to $V_{in}$ returns to the knock detection output. A digital conversion value that is within the knock sensor range is produced by the ADC 502.

FIG. 6C depicts an isolated view of one of the sample and conversion periods during an open pin failure, represented by spike 604. The knock detection analog output is depicted as dashed lines. However, input to the ADC 502 bears no relation to the knock detection analog output due to a pin failure. During time $T_{SAMPLE\_TEST}$, the ADC 502 input is driven towards an out of range limit by $V_{ref\_Hi}$. Spike 604 results. During $T_{SAMPLE}$, the $V_{ref\_Hi}$ connection is released, yet the input to the ADC 502 remains above the out of range limit as there is no knock detection analog output to return to. The disclosed real-time self-test failure detection method will identify such a failure based on a digital conversion value that is out of range for the knock sensor.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

In the presently preferred embodiment, real-time self-test failure detection is implemented in conjunction with a successive approximation register ADC core. However, the real-time self-test failure detection method disclosed can be used with any type of ADC core.

Real-time self-test failure detection is of greatest concern to safety related applications. However, the real-time self-test failure detection method disclosed can be taken advantage of by any application that requires highly reliable data.

In the presently preferred embodiment, real-time self-test failure detection is implemented on a single chip with an ADC core. However, more or fewer functions can be incorporated onto a chip with failure detection. For example, failure detection can be incorporated onto a microprocessor, digital signal processor or ASIC. Real-time self-test failure detection can also be implemented on a stand-alone ADC chip.

It should also be noted that, over time, an increasing number of functions tend to be combined into a single chip.

The disclosed inventions can still be advantageous even with different allocations of functions among chips, as long as the functional principles of operation described above are still observed. For example, the next generation of automotive application intends to reduce the number of component on a board, while targeting higher reliability objectives. The embedded real-time self-test mechanism gives a leading advantage to the components that integrate this function.

What is claimed is:

1. A method of testing an analog-to-digital converter (ADC) comprising:
   connecting an input signal having a predetermined voltage range to an input terminal of said ADC;
   connecting, during a first sample period, a reference voltage to said input terminal, said reference voltage being outside of said voltage range;
   disconnecting said reference voltage during a second sample period, said input signal remaining connected to said input terminal;
   converting voltage on said input terminal to a digital value during a conversion period;
   comparing said digital value to a predetermined set of digital values, said predetermined set corresponding to said voltage range; and
   detecting a failure of said ADC if said digital value is outside said predetermined set.

2. The method of claim 1 wherein said reference voltage is less than said predetermined voltage range.

3. The method of claim 1 wherein said reference voltage exceeds said predetermined voltage range.

4. The method of claim 1 wherein said predetermined voltage range is programmable.

5. The method of claim 1 wherein said input signal is selectable from a plurality of input signals.

6. The method of claim 1 wherein said failure of said ADC is one of an open circuit on an input signal line, a short circuit to power supply voltage on said input signal line and a short circuit to ground on said input signal line.

7. A method of operating an analog-to-digital converter (ADC) to provide self failure detection comprising:
   generating a first sample period in which a sample and hold circuit in said ADC receives a signal applied to an Input terminal of said ADC;
   applying, during said first sample period, an input signal to said input terminal, said input signal having a predetermined amplitude range;
   applying, during said first sample period, a reference signal having an amplitude higher than or lower than said predetermined amplitude range, to said input terminal;
   generating a second sample period in which said sample and hold circuit receives and holds a signal applied to said input terminal;
   applying, during said second sample period, only said input signal to said input terminal,
   generating a conversion period during which a value held in said sample and hold circuit is converted into a digital value;
   determining if said digital value corresponds to said amplitude of said reference signal or is shifted towards said amplitude of said reference signal; and
   detecting a failure on determining said correspondence or shifting.

8. The method of claim 7 wherein said amplitude of said reference signal is less than said predetermined amplitude range.

9. The method of claim 7 wherein said amplitude of said reference signal exceeds said predetermined amplitude range.

10. The method of claim 7 wherein said predetermined amplitude range is programmable.

11. The method of claim 7 wherein said input signal is selectable from a plurality of input signals.

12. The method of claim 7 wherein said failure of said ADC is one of an open circuit on an input signal line, a short circuit to power supply voltage on said input signal line and a short circuit to ground on said input signal line.

13. An analog to digital converter (ADC) having self-test capabilities comprising:
   an input terminal for being coupled to an input signal having a predetermined amplitude range;
   a sample and hold circuit coupled to said input terminal;
   a converter coupled to said sample and hold circuit;
   a control circuit coupled to said sample and hold circuit and to said converter for generating a control signal to provide first and second sample periods and a conversion period;
   a switch coupled to said input terminal and responsive to said control signal for applying a reference signal to said input terminal during said first sample period and not during said second sample period, said reference signal being outside of said predetermined amplitude range; and
   a comparator coupled to an output of said ADC for determining a failure if a digital value generated by said ADC which corresponds to said amplitude of said input signal is outside a range of values which correspond to said predetermined amplitude range.

14. The ADC of claim 13 wherein said failure of said ADC is one of an open circuit on an input signal line, a short circuit to power supply voltage on said input signal line and a short circuit to ground on said input signal line.

15. The ADC of claim 13 further comprising a selection circuit coupled to said input terminal for selecting as said input signal one of a plurality of input signals.

16. The ADC of claim 13 wherein said switch applies a first reference signal having an amplitude below said predetermined amplitude range and a second reference signal which exceeds said predetermined amplitude range.

17. The ADC of claim 16 wherein said first and second reference signals have amplitudes that are programmable.

18. A system for analog-to-digital conversion (ADC system) comprising:
   a self-test controller;
   a real-time failure detection circuit controlled by said self-test controller for detecting failures in said ADC system, said failure detection circuit generating at least a first reference signal which is outside a range of values expected as an input signal;
   an analog-to-digital converter (ADC) for sampling said input signal and converting said sample to a digital value;
   wherein said failure detection circuit applies said reference signal and said input signal to said ADC during a first sample period and only said input signal during a second sample period, and compares a converted output against an expected output range whereby a failure of said ADC system is determined if said converted output is outside said expected output range.

19. The ADC of claim 18 further comprising a switch for applying a first reference signal having an amplitude below said predetermined amplitude range and a second reference signal which exceeds said predetermined amplitude range.

20. The ADC of claim 19 wherein said first and second reference signals have amplitudes that are programmable.

21. The ADC of claim 18 wherein said failure of said ADC is one of an open circuit on an input signal line, a short circuit to power supply voltage on said input signal line and a short circuit to ground on said input signal line.

22. The ADC of claim 18 further comprising a selection circuit coupled to said input terminal for selecting as said input signal one of a plurality of input signals.

23. An engine control system comprising:

a sensor for sensing a state of operation of an engine and generating a monitor signal;

an analog-to-digital converter (ADC) for sampling said monitor signal and converting said sample to a digital value;

a self-test controller;

a real-time failure detection circuit controlled by said self-test controller for detecting failures in said system, said failure detection circuit generating at least a first reference signal which is outside a range of values expected of said monitor signal, wherein said failure detection circuit applies said reference signal and said input signal to said ADC during a first sample period and only said input signal during a second sample period, and compares a converted output against an expected output range whereby a failure of said system is determined if said converted output is outside said expected output range.

24. The system of claim 23 further comprising:

a memory for storing data;

input/output ports for gathering and transmitting data;

a memory unit for storing said digital value, and wherein said failure detection circuit comprises a control unit and status sequencer for analyzing said digital value and indicating failure of said analog-to-digital conversion.

25. The system of claim 23 wherein said real-time failure detection unit includes a switch for applying a first reference signal having an amplitude below said predetermined amplitude range and a second reference signal which exceeds said predetermined amplitude range.

26. The ADC of claim 23 wherein said first and second reference signals have amplitudes that are programmable.

27. The ADC of claim 23 wherein said failure of said ADC is one of an open circuit on an input signal line, a short circuit to power supply voltage on said input signal line and a short circuit to ground on said input signal line.

28. The ADC of claim 23 further comprising a selection circuit coupled to said input terminal for selecting as said input signal one of a plurality of input signals.

* * * * *